United States Patent [19]
Kataoka et al.

[11] Patent Number: 5,582,653
[45] Date of Patent: Dec. 10, 1996

[54] SOLAR CELL MODULE HAVING A SURFACE PROTECTIVE MEMBER COMPOSED OF A FLUORORESIN CONTAINING AN ULTRAVIOLET ABSORBER DISPERSED THEREIN

[75] Inventors: Ichiro Kataoka, Tsuzuki-gun; Takahiro Mori, Ikoma; Satoru Yamada; Hidenori Shiotsuka, both of Tsuzuki-gun; Ayako Komori, Nara, all of Japan

[73] Assignee: Canon Kabushiki Kaisha, Tokyo, Japan

[21] Appl. No.: 426,663

[22] Filed: Apr. 21, 1995

[30] Foreign Application Priority Data

Apr. 28, 1994 [JP] Japan .................................. 6-090987

[51] Int. Cl.⁶ .............................................. H01L 31/048
[52] U.S. Cl. ........................ 136/251; 136/259; 257/133
[58] Field of Search .................................. 136/251, 259; 257/433

[56] References Cited

U.S. PATENT DOCUMENTS 5,273,608 12/1993 Nath .......................................... 156/301
5,482,571 1/1996 Yamada et al. .......................... 136/259
5,530,264 6/1996 Kataoka et al. ........................ 257/40

FOREIGN PATENT DOCUMENTS 0641030 3/1995 European Pat. Off. ............... 136/251
62-273780 11/1987 Japan ................................... 136/251

*Primary Examiner*—Aaron Weisstuch
*Attorney, Agent, or Firm*—Fitzpatrick, Cella, Harper & Scinto

[57] ABSTRACT

A solar cell module comprising (a) a photovoltaic element, (b) a transparent resin filler layer, (c) a transparent surface layer, and (d) a reinforcing member, said transparent resin filler layer (b) and said transparent surface layer (c) being disposed in the named order on a light receiving face of said photovoltaic element, and said reinforcing member (d) being disposed on the rear face of said photovoltaic element, characterized in that said transparent surface layer comprises a film composed of a fluororesin with a high fluorine content selected from the group consisting of ethylene-tetrafluoroethylene copolymer, poly(chlorotrifluoroethylene) resin, ethylene-chlorotrifluoroethylene copolymer, tetrafluoroethyle-perfluoroalkylvinylether copolymer, and tetrafluoroethylene-hexafluoropropylene copolymer and which contains an ultraviolet absorber dispersed therein.

14 Claims, 3 Drawing Sheets

F I G. 1
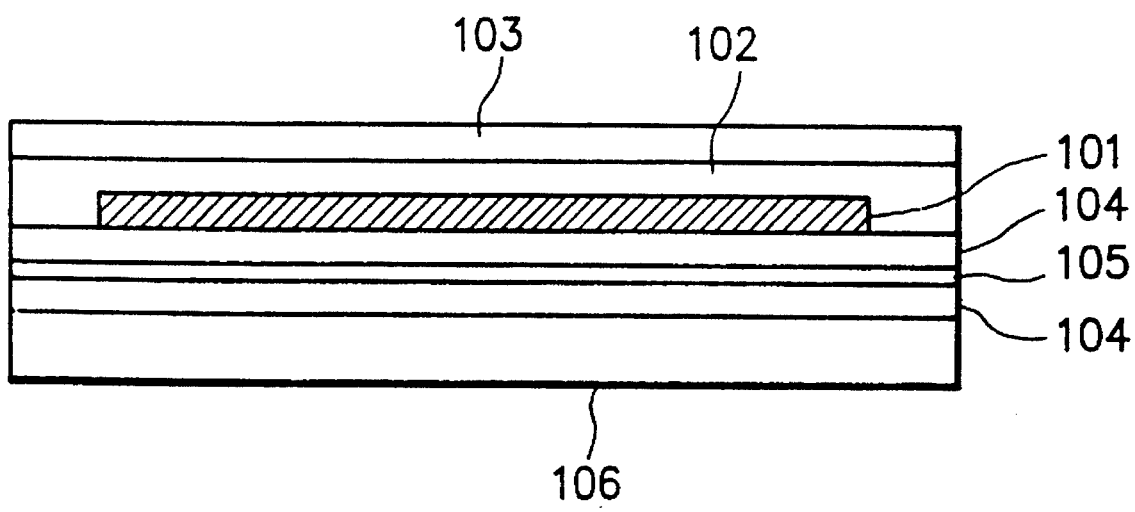

SOLAR CELL MODULE HAVING A SURFACE PROTECTIVE MEMBER COMPOSED OF A FLUORORESIN CONTAINING AN ULTRAVIOLET ABSORBER DISPERSED THEREIN

BACKGROUND OF THE INVENTION

1. Field of the Invention

The present invention relates to an improved, reliable solar cell module which excels in weatherability and in resistance to light degradation and which continuously exhibits a desirable photoelectric conversion efficiency without being deteriorated even upon repeated use over a long period of time under severe environmental conditions of high temperature and high humidity. More particularly, the present invention relates to an improved solar cell module comprising a photovoltaic element enclosed by a filler resin and a surface protective member disposed to cover said photovoltaic element, said surface protective member being composed of a specific fluororesin containing an ultraviolet absorber (hereinafter referred to as a UV absorber) dispersed therein, wherein the photovoltaic element is tightly sealed by means of the aforesaid specific surface protective member with an improved adhesion to the filler resin. The solar cell module excels especially in light transmission and weatherability. Further, the solar cell module excels in resistance to light degradation, moisture resistance, heat resistance and abrasion resistance, and it continuously exhibits a desirable photoelectric conversion efficiency without being deteriorated even upon repeated use over a long period of time under severe environmental conditions of high temperature and high humidity.

2. Related Background Art

In recent years, heating of the earth because of the so-called greenhouse effect due to an increase of atmospheric $CO_2$ has been predicted. In view of this, there is an increased demand for a means of power generation capable of providing clean energy without causing $CO_2$ building.

In order to meet such demand, there have proposed various solar cells which can supply electric power without causing such a problem as above mentioned and are expected to be a future power generation source.

Such a solar cell includes single crystal silicon solar cells, polycrystal silicon solar cells, amorphous silicon solar cells (including microcrystal silicon solar cells), copper indium selenide solar cells, and compound semiconductor solar cells. Of these solar cells, various studies have been made on so-called thin film crystal silicon solar cells, compound semiconductor solar cells, and amorphous silicon solar cells since their semiconductor active layer can be relatively easily formed in a large area and in a desired form and they therefore can be easily produced at a relatively low production cost.

Particularly, thin film amorphous solar cells, specifically, amorphous silicon solar cells, comprising a metal substrate, an amorphous semiconductor active layer disposed on said substrate, and a transparent and conductive layer disposed on said semiconductor active layer have been evaluated as being the most advantageous among the conventional solar cells because their semiconductor active layer comprised of amorphous silicon (hereinafter referred to as a-Si) can be easily formed in a large area and in a desired form on a relatively inexpensive substrate with a low production cost and they are light and excel in shock resistance and flexibility, and in addition, they can be designed into a solar cell module in a desired configuration which can be used as a power generation source.

Now, in the case of an amorphous silicon solar cell having a semiconductor active layer comprising, for example, an a-Si thin film disposed on a glass plate as a substrate, light is impinged through the substrate side, and because of this, the glass plate can be designed to serve as a protective member. However, in the case of the aforementioned solar cell having the a-Si semiconductor active layer disposed on the metal substrate, because the metal substrate does not permit incident light to transmit therethrough, light is impinged through the side opposite the metal substrate, and therefore, it is necessary to dispose an appropriate transparent protective member on the side through which light is impinged such that it protects the solar cell element. In the conventional manner of doing this, a transparent fluorine-containing polymer film having a good weatherability is used as the surface protective member and a transparent thermoplastic resin is used as a filler under the transparent fluorine-containing polymer film.

In fact, the fluorine-containing polymer film is often used in the above described manner, since it is advantageous in that it is satisfactory in terms of weatherability and water-repellency and serves to diminish a deterioration in the photoelectric conversion efficiency of the solar cell element caused due to a reduction in the transmittance of the surface protective member which can occur when the protective member is yellowed or clouded as a result of the protective member having been deteriorated.

As for the thermoplastic resin used as the filler in combination with the fluorine-containing polymer film, it is also often used since it is relatively inexpensive and suitable for protecting the solar cell element.

Now, description will be made of a conventional solar cell module with reference to FIG. 4.

FIG. 4 is a schematic cross-sectional view of an example of a conventional solar cell module. In FIG. 4, reference numeral 401 indicates a photovoltaic element (or a solar cell), reference numeral 402 a transparent thermoplastic resin as a filler, reference numeral 403 a transparent surface protective member comprising a fluorine-containing polymer thin film, and reference numeral 404 an insulating member.

In this solar cell module, the filler disposed on the rear side of the photovoltaic element 401 is comprised of the same thermoplastic resin as that disposed on the side of the photovoltaic element through which light is impinged.

Specific examples of the fluorine-containing polymer thin film used as the transparent surface protective member 403 are fluororesin films such as ETFE (ethylene-tetrafluoroethylene copolymer) film, PVF (polyvinyl fluoride) film, PVDF (polyvinylidene fluoride) film, and the like. Specific examples of the transparent thermoplastic resin used as the filler 402 are EVA (ethylene-vinyl acetate copolymer), butyral resin, and the like.

The insulating member 404 is disposed in order to reinforce the solar cell module while adding an appropriate rigidity thereto. The insulating member 404 is usually comprised of an organic resin film such as nylon film, aluminum foil sandwiched with TEDLAR (trademark name), or the like.

The thermoplastic resin 402 serves as an adhesive between the photovoltaic element 401 and the surface protective member 403 (that is, the fluororesin film) and also as an adhesive between the photovoltaic element and the insulating member 404. In addition to this, the thermoplastic resin 402 also serves as a filler for preventing the photovoltaic element from being externally damaged and from suffering from external shocks.

However, the conventional solar cell module thus constituted has such problems as will be described in the following, because the transparent thermoplastic resin is insufficient in weatherability. That is, when the solar cell module is continuously exposed to sunlight in the outdoors over a long period of time (for example, over 20 years), the thermoplastic resin used as the filler is liable to gel due to continuous irradiation of ultraviolet rays, resulting in its being clouded or it is liable to yellow due to an increase in the number of conjugated double bonds in the chemical structure of the resin as a result of continuous irradiation of ultraviolet rays. The occurrence of such cloudiness or yellowing makes the thermoplastic resin used as the filler to be poor in light transmittance, resulting in reducing the photoelectric conversion efficiency of the solar cell module. Hence, the thermoplastic resin as the filler is insufficient not only in terms of weatherability but also in terms of durability upon repeated use in the outdoors over a long period of time (for example, over 20 years). And these problems will become significant when the solar cell module is placed on the roof of a building or is integrated with the roof and it is continuously used in severe outdoor atmospheres of high temperature and high humidity.

Herein, as for the solar cell module in which the filler is constituted by EVA, it is known that when the solar cell module is continuously used at a temperature of 80° C. or above, the filler is liable to remarkably yellow.

In addition, the deterioration of the transparent thermoplastic resin as the filler causes not only the foregoing problem of reducing its light remittance but also another problem of extinguishing its rubber elasticity and/or reducing its adhesion. In the case where the filler is poor in rubber elasticity, there is a fear that a stress which occurs when the photovoltaic element and/or the electric connection terminals are expanded or shrunk due to a sudden change in the environmental temperature or when the solar cell module is deformed due to an external force applied thereto is not sufficiently absorbed and damages the photovoltaic element or causes a separation between the photovoltaic element and the filler. Further, in the case where the filler is poor in adhesion, there is a fear that a separation is liable to occur between the filler and the photovoltaic element or between the filler and the surface protective member.

Hence, there has not been provided a desirable organic material which has a highly improved weatherability, is highly transparent, and is capable of desirably attaining the requirement desired for the surface coating member of a solar cell module.

SUMMARY OF THE INVENTION

Three of the five present inventors and one other person have previously proposed a photoelectric conversion module (i.e., solar cell module) comprising a photovoltaic element enclosed by a transparent resin filler and a transparent surface protective layer disposed on the light receiving face side of the photovoltaic element, wherein the transparent resin filler is composed of a fluorine-containing polymer resin (i) having a fluorine content of 20 to 40 Wt. % and which has been cross-linked with a peroxide, and the transparent surface protective layer is composed of a fluorine-containing polymer resin (ii) having a fluorine content of 40 to 60 wt. % (see, Japanese patent application No. 216048/1993 (filed Aug. 31, 1993) and Japanese patent application No. 180129/1994 (filed Aug. 1, 1994)). This solar cell module (hereinafter referred to as "prior solar cell module") is aimed at eliminating the occurrence of cloudiness or yellowing of the thermoplastic resin used as the filler in the conventional solar cell module due to incident light, wherein the occurrence of said cloudiness or yellowing makes the thermoplastic resin poor in light transmittance, resulting in reducing the photoelectric conversion efficiency of the solar cell module.

As a result of extensive studies by the present inventors in order to improve the prior solar cell module, it was found that the prior solar cell module has some problems which are necessary to be solved. That is, firstly, the fluorine-containing polymer resin (i) as the filler is essentially inferior to a polyolefin type thermoplastic resin (hereinafter referred to as polyolefinic thermoplastic resin) such as EVA in terms of adhesion. In fact, the fluorine-containing polymer resin (i) as the filler has a tendency of causing a reduction in adhesion particularly with the photovoltaic element under such severe conditions as in an ultra-accelerated moisture deterioration test using pressurized high temperature steam (that is, a so-called pressure cooker test). Such reduction in the adhesion of the filler is liable to cause a separation between the filler and the photovoltaic element when the solar cell module is continuously exposed to sunlight under severe environmental conditions with a high humidity and with frequent changes in the environmental temperature, wherein such separation causes a space to be formed between the filler and the photovoltaic element.

Now, the solar cell module comprises the photovoltaic element enclosed by resin materials only as above described. Thus, it is almost impossible to make the solar cell module to be completely free of moisture invasion. Therefore, when moisture is invaded into the inside of the solar cell module, it is liable to accumulate in the aforesaid space, wherein the moisture thus accumulated contacts the collecting electrode constituted by a highly conductive metal such as Ag of the photovoltaic element to cause a so-called migration phenomenon by repeatedly causing ionization and precipitation for the conductive metal so as to grow an independent metal layer. The metal layer thus grown functions to electrically short-circuit the photovoltaic element, whereby the performance of the photovoltaic element is remarkably reduced. Hence, in order to attain a high reliability for the solar cell module so that it can be desirably used in the outdoors even under severe environmental conditions, it is necessary to make the filler to be free not only from the occurrence of cloudiness or yellowing but also from the occurrence of such separation between the filler and the photovoltaic element in the pressure cooker test.

The prior art solar cell module includes an embodiment wherein the fluorine-containing polymer resin as the filler contains a UV absorber in order to improve the light resistance of the filler and in order to prevent other members situated thereunder from suffering a deleterious influence by ultraviolet rays. However, the UV absorber contained in the filler is liable to gradually volatilize when the solar cell module is continuously exposed to sunlight in outdoors over a long period of time. In addition, when the fluorine-containing polymer resin as the filler is of a fluorine content of 40 wt. % or less, it is liable to gradually deteriorate when it continuously receives irradiation of ultraviolet rays. And even when it contains a UV absorber, there is a tendency that the fluorine-containing polymer resin becomes yellowed or clouded as the UV absorber is volatilized, wherein other members situated thereunder are not sufficiently prevented from suffering from negative influences by ultraviolet rays.

Besides the above problems, the prior art solar cell module has a further problem in that the fluorine-containing polymer resin is more expensive in comparison with a polyolefinic thermoplastic resin such as EVA used as the filler in the conventional solar cell module and in addition to this, the fluorine-containing polymer resin is required to be used in a large amount for the production thereof, and because of this, it is unavoidably costly.

In view of these problems found in the prior art solar cell module, the present inventors made studies of the possibility of obtaining a highly reliable solar cell module using an inexpensive, generally available polyolefinic thermoplastic resin having a relatively high adhesion such as EVA as the filler. However, such polyolefinic thermoplastic resin, specifically EVA, has a problem in that it is liable to deteriorate when it receives irradiation of ultraviolet rays, whereby it is yellowed or clouded. In order to eliminate this problem, it is considered to dispose a surface protective layer capable of preventing ultraviolet rays from passing therethrough on the filler composed of the polyolefinic thermoplastic resin (for example, EVA).

For this purpose, there can be considered the use of an acrylic resin film containing a UV absorber or a polycarbonate resin film containing a UV absorber as the surface protective layer. However, although these resin films are effective in view of simply protecting the filler composed of a polyolefinic thermoplastic resin such as EVA from being influenced by ultraviolet rays, each of them is not satisfactory in weatherability in that each of them is liable to gradually yellow and lose transparency when continuously exposed to sunlight over a long period of time. Hence, each of them is not suitable to be used as the surface protective layer for a solar cell module.

Besides the above, there can be considered the use of a film comprised of a light-resistant fluororesin containing a UV absorber as the surface protective layer. As such a film, there are commercially available a PVF (polyvinyl fluoride) film containing a UV absorber and a PVDF (polyvinylidene fluoride) film containing a UV absorber.

However, each of these films is highly crystalline and poor in transparency. Thus, it is understood that the use of any of these films as the surface protective layer for a solar cell module prevents light from efficiently impinging into the inside of the solar cell module and thus the module is insufficient in terms of the photoelectric conversion efficiency. In addition to this, in the case of using the PVF film containing a UV absorber, since said PVF film is of a remarkably low heat distortion temperature, there is a fear that said PVF film as the surface protective layer of the solar cell module suffers from not only a distortion (or a deformation) but also a reduction in mechanical strength and also a fear of causing a separation between the PVF film and the filler situated thereunder when the solar cell module is used outdoors under high temperature environmental conditions.

Now, such film comprised of a light-resistant fluororesin containing a UV absorber is obtained by mixing a light-resistant fluororesin and a given UV absorber to obtain a mixture, heating said mixture at a given temperature at which said fluororesin is fused to obtain a fused product, and subjecting the fused product to extrusion molding.

In this case, commercially available fluororesins are mostly of more than 200° C. in melting point and because of this, the UV absorber is liable to decompose or volatilize at the temperature used for fusing the fluororesin, whereby it is difficult to obtain a fluororesin film having a desirable function of absorbing ultraviolet rays.

Presently, there has not been provided a fluororesin film having a desirable ultraviolet-screening function which can be used as the surface protective layer for a solar cell module. It is a matter of course that a solar cell module having a surface protective layer comprising such fluororesin film has not yet been provided.

The present inventors have made extensive studies in order to make it possible to use a high fluorine content fluororesin excelling in weatherability, heat resistance, stain resistance, and excellent transparency as the surface protective layer for a solar cell module. The present inventors prepared a film sample by providing a film of a high fluorine content fluororesin (ETFE (ethylene-tetrafluoroethylene copolymer), PCTFE (poly(chlorotrifluoroethyle copolymer)), ECTFE (ethylene-chlorotrifluoroethylene copolymer), PFA (tetrafluoroethyle-perfluoroalkylvinylether copolymer), or FEP (tetrafluoroethylene-hexafluoropropylene copolymer)) and incorporating a given UV absorber into the fluororesin film by means of conventional absorption or thermal diffusion. Using the resultant film sample, there was prepared a solar cell module comprising a photovoltaic element enclosed by a filler composed of a polyolefinic thermoplastic resin and a surface protective layer comprising said fluororesin film sample disposed on said filler. The resultant solar cell module was examined from various viewpoints. As a result, there were obtained the following findings. That is, there is ensured a sufficient adhesion not only between the photovoltaic element and the filler but also between the filler and the surface protective layer; the photovoltaic element is maintained in a desirable state without being deteriorated even upon repeated use in the outdoors over a long period time with not only the filler but also the surface protective layer not being negatively influenced by ultraviolet rays; the solar cell module excels in weatherability, moisture resistance, heat resistance and abrasion resistance; and the solar cell module continuously exhibits a desirable photoelectric conversion efficiency without being deteriorated even upon repeated use over a long period of time under severe environmental conditions of high temperature and high humidity. The present invention has been accomplished based on these findings.

A principal object of the present invention is to provide a highly reliable solar cell module having an improved surface protective layer comprising a specific fluororesin resin film containing a UV absorber dispersed therein which is hardly deteriorated even upon continuous exposure to sunlight over a long period of time and which allows light to effectively pass therethrough into the inside of the module so that the photovoltaic element effectively exhibits a desirable photoelectric conversion efficiency.

Another object of the present invention is to provide a highly reliable solar cell module having an improved surface protective layer disposed on a filler composed of a polyolefinic thermoplastic resin in which a photovoltaic element is enclosed, said surface protective layer comprising a specific fluororesin resin film containing a UV absorber dispersed therein, wherein said surface protective layer effectively prevents said polyolefinic thermoplastic resin filler from being yellowed or clouded by ultraviolet rays even upon continuous exposure to sunlight over a long period of time and allows light to effectively arrive in the photovoltaic element so that desirable photoelectric conversion efficiency is provided.

A further object of the present invention is to provide a highly reliable solar cell module having an improved surface protective layer disposed on a filler composed of a polyolefinic thermoplastic resin in which a photovoltaic element is enclosed, said surface protective layer comprising a specific fluororesin resin film containing a UV absorber dispersed therein, wherein a sufficient adhesion is ensured not only between the photovoltaic element and the filler but also between the filler and the surface protective layer, the surface protective layer effectively prevents the filler from being yellowed or clouded by ultraviolet rays even upon continuous exposure to sunlight over a long period of time, and it allows light to effectively arrive in the photovoltaic element so that a desirable photoelectric conversion efficiency is provided.

A further object of the present invention is to provide a highly reliable solar cell module having an improved surface protective layer disposed on a filler composed of a polyolefinic thermoplastic resin containing a UV absorber in which a photovoltaic element is enclosed, said surface protective layer comprising a specific fluororesin resin film containing a UV absorber dispersed therein, wherein a sufficient adhesion is ensured not only between the photovoltaic element and the filler but also between the filler and the surface protective layer, the surface protective layer effectively prevents the UV absorber contained in the filler from being volatilized so that the filler is not deteriorated even upon continuous exposure to sunlight over a long period of time, and it allows light to effectively arrive in the photovoltaic element so that a desirable photoelectric conversion efficiency is provided.

A further object of the present invention is to provide a highly reliable solar cell module in which the filler is comprised of a conventional polyolefinic thermoplastic resin which can be produced at a reduced production cost.

BRIEF DESCRIPTION OF THE DRAWINGS

FIG. 1 is a schematic cross-sectional view illustrating the structure of a solar cell module according to the present invention.

DESCRIPTION OF THE INVENTION AND PREFERRED EMBODIMENTS

Figure 2A:
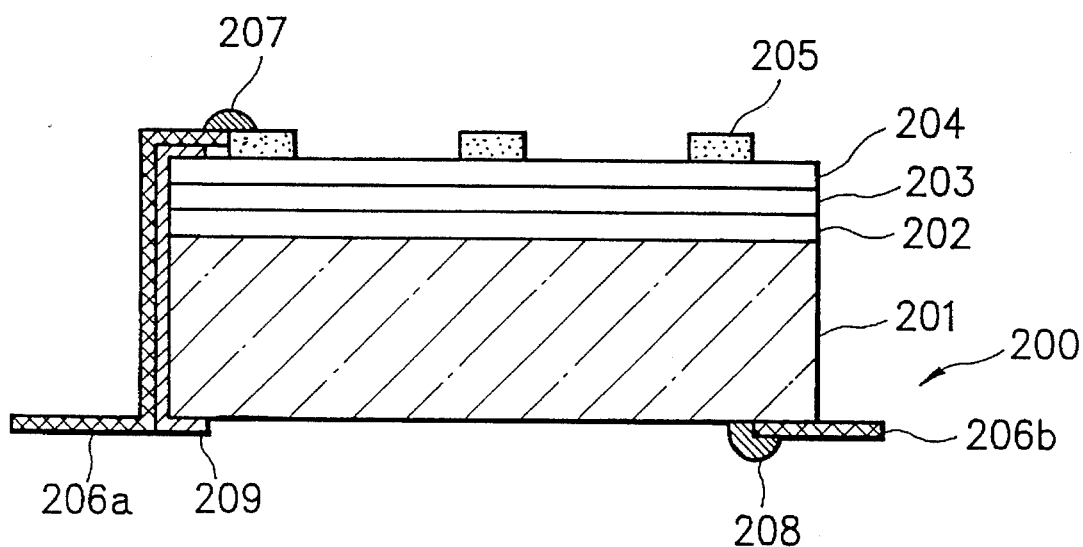
FIG. 2(a) is a schematic cross-sectional view illustrating the structure of a photovoltaic element which can be used in the present invention.

The present invention is to eliminate the foregoing problems in the prior art and also in the foregoing prior solar cell module and to attain the above described objects.

A typical embodiment of the solar cell module according to the present invention comprises (a) a photovoltaic element comprising a substrate and a photoelectric conversion layer with at least a pair of electrodes disposed on said substrate, (b) a transparent resin filler layer, (c) a transparent surface layer, and (d) a reinforcing member, said transparent resin filler layer (b) and said transparent surface layer (c) being disposed in the named order on the light receiving face of said photovoltaic element, and said reinforcing member (d) being disposed on the rear face of said photovoltaic element, characterized in that said transparent surface layer comprises a film composed of a fluororesin with a high fluorine content selected from the group consisting of ethylene-tetrafluoroethylene copolymer (ETFE), poly(chlorotrifluoroethylene copolymer) (PCTFE), ethylene-chlorotrifluoroethylene copolymer (ECTFE), tetrafluoroethyleneperfluoroalkylvinylether copolymer (PFA), and tetrafluoroethylene-hexafluoropropylene copolymer (FEP) and which contains an ultraviolet absorber (a UV absorber) dispersed therein uniformly or unevenly in the thickness direction, said film (hereinafter referred to as UV absorber-bearing fluororesin film) having an improved ultraviolet-screening function.

The UV absorber-bearing fluororesin film is formed by an absorption process wherein a resin film of ETFE, PCTFE, ECTFE, PFA or FEP is immersed in an organic solvent such as xylene or toluene containing a given UV absorber dissolved therein, if necessary, while heating, to thereby incorporate said UV absorber into said resin film, followed by drying the resultant at a desired temperature to volatilize the solvent, or a thermal diffusion method wherein a resin film of ETFE, PCTFE, ECTFE, PFA or FEP is placed in a vacuum chamber containing solid particles of a given UV absorber, the solid particles of the UV absorber are heated to generate a vapor of the UV absorber and the resin film is exposed to said vapor, whereby the UV absorber is incorporated into the resin film.

The transparent resin filler layer is typically composed of a polyolefin series thermoplastic resin such as ethylene-vinyl acetate copolymer (EVA), ethylene-methyl acrylate copolymer (EMA), or ethylene-ethyl acrylate copolymer (EEA).

The UV absorber-bearing fluororesin film having an improved ultraviolet-screening function as the transparent surface layer (that is, the surface protective layer) in the solar cell module according to the present invention is highly transparent and excels in physical strength and in adhesion with a thermoplastic resin, especially, a polyolefin series thermoplastic resin. Because of this, the use of the UV absorber-bearing fluororesin film having an improved ultraviolet-screening function as the surface protective layer makes it possible to effectively use a polyolefin series thermoplastic resin such as EVA, EMA, or EEA as the filler to enclose the photovoltaic element, wherein there is ensured a sufficient adhesion between the photovoltaic element and the filler and also between the filler and the surface protective layer. And although the filler is composed of such polyolefin series thermoplastic resin which is liable to yellow or cloud with irradiation of ultraviolet rays, the filler is maintained in a stable state without being yellowed or clouded because of the presence of the specific surface protective layer thereon even upon continuous exposure to sunlight over a long period of time.

The solar cell module according to the present invention is highly reliable, excels in weatherability and in resistance to light degradation, and continuously exhibits a desirable photoelectric conversion efficiency without being deteriorated even upon repeated use over a long period of time under severe environmental conditions of high temperature and high humidity. Further, the solar cell module excels in resistance to light degradation, moisture resistance, heat resistance, and abrasion resistance.

In the following, detailed description will be made of the solar cell module according to the present invention.

FIG. 1 is schematic cross-sectional view illustrating the construction of an example of a solar cell module according to the present invention.

FIG. 1, reference numeral 101 indicates a photovoltaic element, reference numeral 102 a transparent or substantially transparent filler (this filler will be hereinafter referred to as surface side filler), reference numeral 103 a transparent or substantially transparent film which is positioned at the outermost surface (this film will be hereinafter referred to as surface protective film or surface protective layer), reference numeral 104 as a filler on the rear side of the photovoltaic element 101 (this filler will be hereinafter referred to as backside filler), reference numeral 105 a back face protective film, and reference numeral 106 a back face reinforcing member.

In the solar cell module shown in FIG. 1, light is impinged through the side to the surface protective layer 103, and passes through the surface protective layer 103 and the filler 102 to arrive at the photovoltaic element 101. A photoelectromotive force generated in the photovoltaic element 101 is outputted through output terminals. (not shown).

The photovoltaic element 101 comprises at least a semiconductor active layer as a photoelectric conversion member disposed on an electroconductive substrate.

Figure 2B:
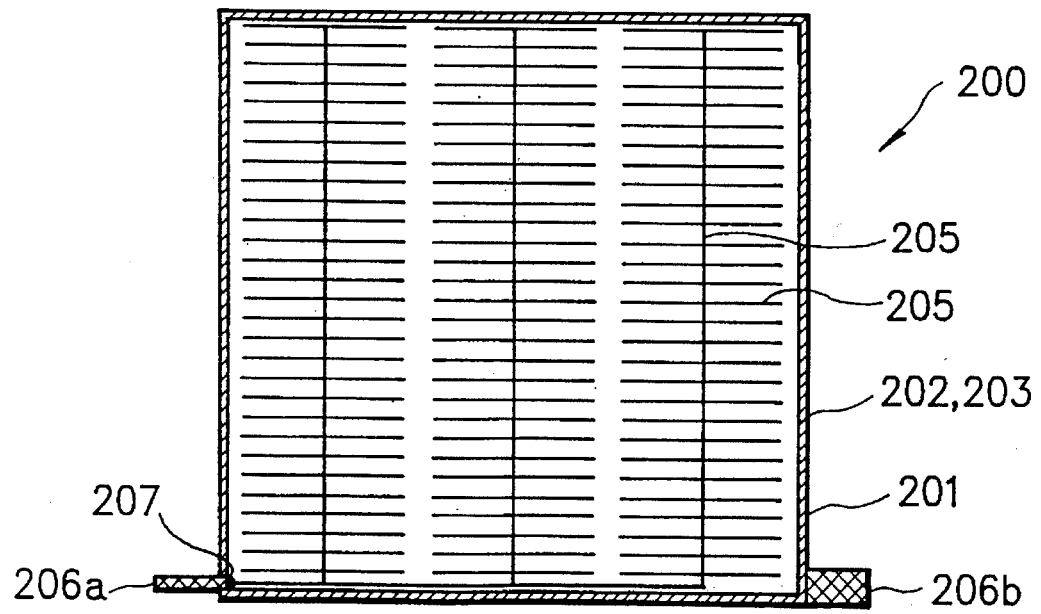
FIG. 2(b) is a schematic plan view illustrating a light receiving face of the photovoltaic element shown in FIG. 2(a).

FIG. 2(a) is a schematic cress-sectional view illustrating the constitution of such photovoltaic element. FIG. 2(b) is a schematic plan view illustrating the light receiving face of the photovoltaic element shown in FIG. 2(a).

In FIGS. 2(a) and 2(b), reference numeral 200 indicates the entire photovoltaic element, reference numeral 201 an electroconductive substrate, reference numeral 202 a back reflecting layer, reference numeral 203 a semiconductor active layer, reference numeral 204 a transparent and conductive layer, reference numeral 205 a collecting electrode (or a grid electrode), reference numeral 206a a positive power output terminal, reference numeral 206b a negative power output terminal, reference numeral 207 an electroconductive adhesive, reference numeral 208 a solder, and reference numeral 209 an insulating member.

As apparent from FIGS. 2(a) and 2(b), the photovoltaic element 200 comprises the back reflecting layer 202, the semiconductor active layer 203, the transparent and conductive layer 204, and the collecting electrode 205 disposed in this order on the electroconductive substrate 201, wherein the output terminal 206a is electrically connected to the collecting electrode 205 by means of the electroconductive adhesive 207 and it extends from the collecting electrode 205 while being insulated from the various layers 201–204 by means of the insulating member 209, and the output terminal 206b is electrically connected to the electroconductive substrate 201 by means of the solder 208. In this configuration, the positive power output terminal and the negative power output terminal may be changed into a negative power output terminal and a positive power outputting terminal, depending upon the constitution of the semiconductor active layer.

Each of the constituents of the solar cell module according to the present invention will now be detailed.

Electroconductive Substrate

Electroconductive substrate 201 serves not only as a substrate for the photovoltaic element but also as a lower electrode. As for the electroconductive substrate 201, there is no particular restriction as long as it has an electroconductive surface. Specifically, it may be an electroconductive member composed of a metal such as Ta, Mo, W, Cu, Ti, Al, or the like, or an electroconductive member composed of an alloy of these metals such as stainless steel. Other than these, the electroconductive substrate may comprise a carbon sheet or a Pb-plated steel sheet. Alternatively, the electroconductive substrate may be a film or sheet made of a synthetic resin or a sheet made of a ceramic. In this case, the substrate is deposited with an electroconductive film of $SnO_2$, $ZnO_2$, ITO, or the like on the surface thereof.

Back Reflecting Layer

The back reflecting layer 202 disposed on the electroconductive substrate 201 may comprise a metal layer, a metal oxide layer, or a two-layered structure comprising a metal layer and a metal oxide layer. The metal layer may be composed of a metal such as Ti, Cr, Mo, W, Al, Ag, Ni, or the like. The metal oxide layer may comprise an oxide of said metals, or an other metal oxide such as ZnO, $SnO_2$, or the like.

The back reflecting layer 202 is desired to have a roughened surface in order to make incident light effectively utilized.

The back reflecting layer 202 may be properly formed by a conventional film-forming technique such as resistance heating evaporation, electron beam evaporation or sputtering.

Semiconductor Active Layer

The semiconductor active layer 203 performs photoelectric conversion. The semiconductor active layer may be composed of a single crystal silicon semiconductor material, a non-single crystal silicon semiconductor material such as an amorphous silicon semiconductor material (including a microcrystalline silicon semiconductor material) or polycrystalline silicon semiconductor material, or a compound semiconductor material. In any case, the semiconductor active layer comprised of any of these semiconductor materials may be of a stacked structure with a pin junction or a Schottky type junction. Specific examples of the compound semiconductor materials and junctions are $CuInSe_2$, $CuInS_2$, GaAs, $CdS/Cu_2S$, CdS/CdTe, CdS/InP, $CdTe/Cu_2Te$, and the like.

The semiconductor active layer comprised of any of the above mentioned semiconductor materials may be formed by a conventional film-forming technique. For instance, the non-single crystal silicon semiconductor active layer may be formed by a conventional chemical vapor phase deposition technique such as plasma CVD or photo-induced CVD using a film-forming raw material gas capable of supplying silicon atoms, such as silane gas or a conventional physical vapor phase film formation technique such as sputtering using a Si-target. The semiconductor active layer composed of a polycrystalline silicon semiconductor material may be formed by a conventional polycrystalline silicon film-forming manner of providing a fused silicon material and subjecting the fused silicon material to film-forming processing or another conventional polycrystalline silicon film-forming method of subjecting an amorphous silicon material to heat treatment.

The semiconductor active layer composed of any of the above mentioned compound semiconductor materials may be formed by a conventional ion plating, ion beam deposition, vacuum evaporation, sputtering or electrolytic deposition in which a precipitate is deposited by means of electrolysis of a desired electrolyte.

Transparent and Conductive Layer

The transparent and conductive layer 204 functions as an upper electrode. The transparent and conductive layer may comprise $In_2O_3$, $SnO_2$, ITO ($In_2O_3$—$SnO_2$), ZnO, $TiO_2$, or $Cd_2SnO_4$. In addition, it may comprise a crystalline semiconductor layer doped with an appropriate impurity at a high concentration.

The transparent and conductive layer constituted by any of the above mentioned materials may be formed by a conventional resistance heating evaporation, electron beam evaporation, sputtering, spraying, or CVD.

The above described impurity-doped crystalline semiconductor layer as the transparent and conductive layer may be formed by a conventional impurity-diffusion film-forming method.

Collecting Electrode

The collecting electrode (or the grid electrode) 205 serves to effectively collect the electric current generated by virtue of a photoelectromotive force on the transparent and conductive layer 204. The collecting electrode is desired to be in the shape of a comb.

The collecting electrode may comprise a metal such as Ti, Cr, Mo, W, Al, Ag, Ni, Cu, Sn, or an alloy of these metals. Alternatively, the collecting electrode may be formed of an electroconductive paste. The electroconductive paste can include electroconductive pastes comprising powdered Ag, Au, Cu, Ni, or carbon dispersed in an appropriate binder resin. The binder resin can include polyester, epoxy resin, acrylic resin, alkyd resin, poly vinyl acetate, rubber, urethane resin, and phenol resin.

The collecting electrode may be formed by a conventional sputtering using a mask pattern, resistance heating evaporation, or CVD. It may also be formed by depositing a metal film over the entire surface and subjecting the metal film to etching treatment to form a desired pattern, by directly forming a grid electrode pattern by means of photo-induced CVD, or by forming a negative pattern corresponding to a grid electrode pattern and subjecting the resultant to plating treatment.

The formation of the collecting electrode using the above described electroconductive paste can be conducted by screen printing.

Power Output Terminals

The power output terminals 206a and 206b serve to output an electromotive force. The output terminal 206a is electrically connected to the collecting electrode 205 by means of the electroconductive paste 207 in FIG. 2(a). Alternatively, the electrical connection in this case may be formed by using an appropriate connecting metal body and an electroconductive paste or solder.

The output terminal 206b is electrically connected to the electroconductive substrate by means of the solder 208 in FIG. 2(a). Alternatively, the electrical connection in this case may be formed by spot welding or soldering an appropriate metal body such as a copper tab.

There are provided a plurality of photovoltaic elements having the above constitution, and they are integrated in series or parallel connection depending upon the desired voltage or electric current. It is possible to dispose the integrated body on an insulating member such that a desired voltage or electric current can be obtained.

Now, description will be made of the other constituents of the photovoltaic module shown in FIG. 1.

Back Face Protective Film

The back face protective film 105 in FIG. 1 is used for electrically isolating the electroconductive substrate 201 of the photovoltaic element from external materials including the back face reinforcing member.

The back face protective film 105 is desired to be composed of a material capable of sufficiently electrically isolating the electroconductive substrate and which excels in durability, withstands a thermal expansion and thermal contraction, and excels in flexibility. Specific examples of such material are nylon, polyethylene terephthalate (PET), and the like.

Backside Filler

The backside filler 104 serves to ensure the adhesion between the photovoltaic element 101 and the back face protective film 105. The backside filler 104 is desired to comprise a material capable of sufficiently ensuring the adhesion between the electroconductive substrate of the photovoltaic element and the back face protective film and which excels in durability, withstands thermal expansion and thermal contraction, and excels in flexibility. Specific examples of such material are hot-melt materials such as EVA (ethylene-vinyl acetate copolymer) and polyvinyl butyral, and epoxy adhesives. Besides these, double-coated tapes may be also used.

When the solar cell module is integrated with a roof of a building in order to use it outdoors, it is desired to use a material capable of being crosslinked as the backside filler in order to attain a sufficient adhesion between the electroconductive substrate of the photovoltaic element and the back face protective film so that the solar cell module can endure repeated use at high temperature.

Incidentally, EVA can be crosslinked with the use of an organic peroxide.

Back Face Reinforcing Member

The back face reinforcing member 106 is disposed below the back face protective film 105 as shown in FIG. 1, for the purposes of improving the mechanical strength of the solar cell module and preventing the solar cell module from being distorted or warped due to a change in the environmental temperature. The back face reinforcing member may comprise a steel plate, a plastic plate, or a fiberglass reinforced plastic plate (or so-called FRP plate).

Surface Side Filler

The surface side filler 102 serves to cover the irregularities at the surface of the photovoltaic element, to prevent the photovoltaic element from being influenced by external factors such as temperature changes and/or humidity changes in the external environment, externally applied impacts, or the like and to attain a sufficient adhesion between the photovoltaic element and the surface protective layer. Thus, the surface side filler is required to excel especially in weatherability, adhesion, packing property, heat resistance, cold resistance, and impact resistance. In order for the surface side filler to meet these requirements, the surface side filler is comprised of a resin selected from the group consisting of polyolefinic resins, butyral resins, urethane resins, and silicone resins. Specific examples of said polyolefinic resin are ethylene-vinyl acetate copolymer (EVA), ethylene-methyl acrylate copolymer (EMA), ethylene-ethyl acrylate copolymer (EEA). Of these resins, EVA is the most desirable because it exhibits well-balanced physical properties suitable for a solar cell when used as the surface side filler.

Any of the above mentioned resins usable as the surface said filler (this resin will be hereinafter referred to as filler resin) is low in heat deformation temperature and is liable to readily deform or creep at a high temperature. Because of this, the filler resin is desired to be crosslinked with an appropriate crosslinking agent so that it has an increased heat resistance. As the crosslinking agent, there can be mentioned organic peroxides.

The crosslinking of the filler resin used as the surface side filler using an organic peroxide as the crosslinking agent is performed by way of incorporating hydrogen atoms or halogen atoms in the resin by virtue of free radicals generated from the organic peroxide to form C—C bonds.

In order to make the organic peroxide generate such free radicals upon crosslinking the filler resin, the organic peroxide is desired to be activated by means of a thermal decomposition process, redox decomposition process, or ion decomposition process. Of these processes, the thermal decomposition process is the most appropriate.

The organic peroxide usable as the crosslinking agent in the present invention can include hydroperoxide, dialkyl (diallyl) peroxide, diacyl peroxide, peroxyketal, peroxyester, peroxycarbonate, and ketone peroxide.

Specific examples of the hydroperoxide are t-butyl hydroperoxide, 1,1,3,3-tetramethylbutyl hydroperoxide, p-menthane hydroperoxide, cumene hydroperoxide, p-cymene hydroperoxide, diisopropylbenzene hydroperoxide, 2,5-dimethylhexane-2,5-dihydroperoxide, cyclohexane hydroperoxide, and 3,3,5-trimethylhexanone hydroperoxide.

Specific examples of the dialkyl (diallyl) peroxide are di-t-butyl peroxide, dicumyl peroxide, and t-butylcumyl peroxide.

Specific examples of the diacyl peroxide are diacetyl peroxide, dipropyonyl peroxide, diisobutyryl peroxide, dicotanoyl peroxide, dideconoyl peroxide, dilauroyl peroxide, bis(3,3,5-trimethylhexanoyl)peroxide, benzoyl peroxide, m-toluyl peroxide, p-cholorobenzoyl peroxide, 2,4-dichlorobenzoyl peroxide, and peroxysuccinic acid.

Specific examples of the peroxyketal are 2,2-di-t-butylperoxybutane, 1,1-di-t-butylperoxycyclohexane, 1,1,-di-(t-butylperoxy)-3,3,5-trimethylcyclohexane, 2,5-dimethyl-2,5-di(t-butylperoxy)hexane, 2,5-dimethyl-2,5-di(t-butylperoxy)hexin-3,1,3-di(t-butylperoxyisopropyl)benzene, 2,5-dimethyl-2,5-dibenzoylperoxyhexane, 2,5-dimethyl-2,5-di(peroxybenzoyl)hexin-3, and n-butyl-4,4-bis(t-butylperoxy)valerate.

Specific examples of the peroxyester are t-butylperoxy acetate, t-butylperoxyisobutylate, t-butylperoxypivalate, t-butylperoxyneodecanoate, t-butylperoxy-3,3,5-trimethylhexanoate, t-butylperoxy-2-ethylhexanoate, (1,1,3,3-tetramethylbutylperoxy)-2-ethylhexanoate, t-butylperoxylaurate, t-butylperoxybenzoate, di(t-butylperoxy)adipate, 2,5-dimethyl-2,5-di(peroxy-2-ethylhexanoyl)hexane, di(t-butylperoxy)isophthalate, t-butylperoxymalate, and acetylcyclohexylsulfonylperoxide.

Specific examples of the peroxycarbonate are t-butylperoxyisopropylcarbonate, di-n-propylperoxydicarbonate, di-sec-butylperoxydicarbonate, di(isopropylperoxy)dicarbonate, di(2-ethylhexylperoxy)dicarbonate, di(2-ethoxyethylperoxy)dicarbonate, di(methoxypropylperoxy)carbonate, di(3-methoxybutylperoxy)dicarbonate, and bis-(4-t-butylcyclohexylperoxy)dicarbonate.

Specific examples of the ketone peroxide are acetylacetone peroxide, methyl ethyl ketone peroxide, methylisobutyl ketone peroxide, and cyclohexanone peroxide.

Besides these compounds, vinyltris(t-butylperoxy) silane may be also used.

The amount of such organic peroxide as the crosslinking agent to be added to the filler resin as the surface side filler is preferably in the range of from 0.5 to 5 parts by weight versus 100 parts by weight of the filler resin.

In the case where the amount of the organic peroxide added is less than 0.5 part by weight, the filler resin is not sufficiently crosslinked. In this case, the filler is liable to deform due to the heat applied, whereby the filler is difficult to be maintained in a desired form. On the other hand, in the case where the amount of the added organic peroxide exceeds 5 parts by weight, a certain amount of not only the organic peroxide but also decomposed products thereof is liable to remain in the filler, resulting in making the filler insufficient in terms of heat resistance and weatherability (light resistance).

The organic peroxide as the crosslinking agent may be used together with the filler resin as the surface side filler upon thermocompression-bonding the filler, wherein the filler is bonded to the photovoltaic element and also to the surface protective layer while being crosslinked with the organic peroxide. Conditions of temperature and period of time for the thermocompression-bonding treatment in this case may be determined depending upon the thermodecomposition temperature property of the organic peroxide used. However, in general, these conditions are determined to be such that 90% or more, or preferably 95% or more of the organic peroxide in the filler is thermally decomposed, whereby the filler is subjected to thermocompression-bonding to the photovoltaic element and to the surface protective layer while being crosslinked.

The degree of crosslinking of the filler resin can be examined by observing the gel content of the filer resin. In order to prevent the filler resin from being deformed, it is desired for the filler resin to be crosslinked such that the gel content is 70 wt. % or more.

In order to efficiently crosslink the filler resin, it is desired to use a crosslinking enhancer such as triarylcyanurate in addition to the organic peroxide as the crosslinking agent. In this case, the amount of the crosslinking enhancer to be added is in the range of from 1 to 5 parts by weight versus 100 parts by weight of the filler resin.

The surface side filler comprised essentially of the above described filler resin excels in weatherability. However, in order to attain a further improved weatherability of the surface side filler and also in order to effectively protect a layer situated thereunder, it is possible for the surface side filler to contain an appropriate UV absorber. As such UV absorber, there can be mentioned commercially available chemical compounds usable as a UV absorber. In a preferred embodiment, it is desired to use a UV absorber having a low volatility.

Further, in order to improve the resistance to photoinduced degradation of the surface side filler, it is possible for the surface side filler to contain an appropriate photo stabilizer. Further in addition, in order to improve the heat resistance of the surface side filler, it is possible for the surface side filler to contain an appropriate antioxidant.

Now, in the case where the solar cell module is used under severe environmental conditions, it is desired to have excellent adhesion between the surface side filler and the photovoltaic element and also between the surface side filler and the surface protective layer. In order for the surface side filler to attain such adhesion, it is effective to incorporate an appropriate silane coupling agent to the surface side filler.

Specific examples of such silane coupling agent are vinyltrichlorosilane, vinyltris(β-methoxy)silane, vinyltriethoxysilane, vinyltrimethoxysilane, γ-methacryloxypropyltrimethoxysilane, β-(3,4-epoxycyclohexyl)ethyltromethoxysilane, γ-glycidoxypropylmethyldiethoxysilane, N-β(aminoethyl)-γ-aminopropyltrimethoxysilane, N-β(aminoethyl)γ-aminopropylmethyldimethoxysilane, γ-aminopropyltriethoxysilane, N-phenyl-γ-aminopropyltrimethoxysilane, γ-mercaptopropyltrimethoxysilane, and γ-chloropropyltrimethoxysilane.

Surface Protective Layer (or Surface Protective Film)

The surface protective layer 103 (or the surface protective film) is positioned at the outermost surface of the solar cell module and because of this, it is required to excel in transparency, weatherability, water repellency, heat resistance, pollution resistance, and physical strength. In addition, in the case where the solar cell module is used under severe environmental conditions outdoors, it is required for the surface protective layer to ensure that the solar cell model is of sufficient durability upon repeated use over a long period of time. Further in addition, in order to make the solar cell module capable of being continuously used under high temperature environmental conditions over a long period of time, it is desired for the surface protective layer to be formed of a resin film with a deformation temperature of 70° C. or above at a pressure of 4.6 kg/cm².

In order for the surface protective layer to satisfy all these conditions, the surface protective layer comprises a film composed of a specific highly transparent fluororesin containing a UV absorber uniformly or unevenly dispersed therein in the thickness direction and having a good ultraviolet-screening function.

Specific examples of the highly transparent fluororesin are ethylene-tetrafluoroethylene copolymer (EFTE), poly(chlorotrifluoroethylene) resin (PCTFE), ethylene-chlorotrifluoroethylene copolymer (ECTFE), tetrafluoroethylene-perfluoroalkylvinylether copolymer (PFA), and tetrafluoroethylene-hexafluoropropylene copolymer (FEP).

As the UV absorber, it is desired to use an UV absorber having a molecular weight of 300 or more in view of preventing it from volatilizing from the surface of the film in which it is contained when the film is exposed to a high temperature. As such UV absorber, there can be mentioned commercially available aromatic organic compounds having a molecular weight of 300 or more usable as a UV absorber. Said aromatic organic compounds can include benzophenone series compounds, and benzotriazole series compounds.

Specific examples of such benzophenone series compound are 2,4-hydroxybenzophenone, 2-hydroxy-4-methoxybenzophenone, 2-hydroxy-4-octoxybenzophenone, 2-hydroxy-4-dodecyloxybenzophenone, 2,2'-hydroxy-4-methoxybenzophenone, 2'2'-dihydroxy-4,4'-dimethoxybenzophenone, 2-hydroxy-4-methoxy-5-sulfobenzophenone, and bis(2-methoxy-4-hydroxy-5-benzophenone)methane.

Specific examples of such benzotriazole series compound are 2-(2-hydroxy-5-tert-octylphenyl)benzotriazole, 2-(2'-hydroxy-5'-methylphenyl)benzotriazole, 2-(2'-hydroxy-5'-tert-butylphenyl)benzotriazole, 2-(2'-hydroxy-3',5'-di.tert-butylphenyl)benzotriazole, 2-(2'-hydroxy-3'-tert-butyl-5-methylphenyl)-5-chlorobenzotriazole, 2-(2'-hydroxy-3',5'-di.tert-butylphenyl)-5-chlorobenzotriazole, 2-(2'-hydroxy-3',5'-di.tert-amylphenyl)benzotriazole, 2-[2'-hydroxy-3'-(3",4"5",6"-tetrahydrophthalimidomethyl)-5'-methylphenyl] benzotriazole, and 2,2,-methylenebis[4(1,1,3,3-tetramethylbutyl)-6-(2H-benzotriazole-2-yl)phenol].

The film composed of any of the above described highly transparent fluororesins (that is, ETFE, PCTFE, ECTFE, PFA, or FEP) containing a UV absorber uniformly or unevenly dispersed therein in the thickness direction and having a good ultraviolet-screening function as the surface protective layer according to the present invention may be formed by a so-called absorption method wherein a fluororesin film is immersed in an organic solvent containing a UV absorber dissolved therein to incorporate the UV absorber into the fluororesin film or a so-called thermal diffusion method wherein a fluororesin film is exposed to a vapor of a UV absorber to incorporate the UV absorber into the fluororesin film.

In the present invention, the incorporation of a UV absorber into a film composed of any of the above described highly transparent fluororesins (this film will be hereinafter referred to as fluororesin film) is conducted by firstly providing said fluororesin film and incorporating a desired UV absorber selected from those UV absorbers above mentioned into the fluororesin film in accordance with the above-described absorption method or thermal diffusion method. The reason for this is that the conventional film-forming method employed in the case of forming a film from polyvinyl fluoride wherein a latent solvent is used cannot be used because the highly transparent fluororesin (ETFE, PCTFE, ECTFE, PFA, or FEP) used in the present invention is insoluble in the latent solvent although the UV absorber is soluble therein. Also, the conventional extrusion molding method of forming a film from a resin wherein the resin is fused at a temperature of higher than 200° C. and followed by extrusion molding treatment cannot be used because the UV absorber is readily decomposed or volatilized when it is heated at such high temperature of 200° C. or above.

As for the amount of the UV absorber to be incorporated into the highly transparent fluororesin as the surface protective layer in the present invention, there is no particular limitation therefor as long as the UV absorber is compatible with the fluororesin.

However, in order for the surface protective layer to exhibit a desirable ultraviolet-screening function while selectively absorbing ultraviolet rays, it is desired that the light transmittance of the surface protective layer comprising (a) a film composed of any of the foregoing fluororesins containing a given UV absorber when measured with light having a wavelength of 300 to 350 nm be 0.8 or less in terms of a value relative to that of (b) a film composed of the same fluororesins as the film (a) but containing no UV absorber, when measured with light having a wavelength of 300 to 350 nm, wherein the latter's light transmittance is set at 1 and the light transmittance of the film (a) when measured with light having a wavelength of 400 to 1000 nm is 0.9 or more in terms of a value relative to that of the film (b) when measured with light having a wavelength of 400 to 1000 nm, wherein the latter's light transmittance is set at 1. In a preferred embodiment, the light transmittance of the film (a) when measured with light having a wavelength of 300 to 350 nm is 0.5 or less in terms of a value relative to that of the film (b) when measured with light having a wavelength of 300 to 350 nm and the light transmittance of the film (a) when measured with light having a wavelength of 400 to 1000 nm is 0.9 or more in terms of a value relative to that of the film (b) when measured with light having a wavelength of 400 to 1000 nm. When the light transmittance of the film (a) when measured with light having a wavelength of 300 to 350 nm exceeds 0.8 in terms of a value relative to that of the film (b) when measured with light having a wavelength of 300 to 350 nm, there is a tendency that ultraviolet rays pass through the surface protective layer into the filler of enclosing the photovoltaic element, whereby problems are liable to result in that the filler is deteriorated by being yellowed and/or clouded due to the ultraviolet rays absorbed therein to cause a separation at the interface between the filler and the surface protective layer and/or at the interface between the filler and the photovoltaic element. On the other hand, when the light transmittance of the film (a) when measured with light having a wavelength of 400 to 1000 nm is less than 0.9 in terms of a value relative to that of the film (b) when measured with light having a wavelength of 400 to 1000 nm, there is a tendency that light in a wavelength region effective for power generation by the photovoltaic element is prevented from arriving at the photovoltaic element, resulting in the solar cell module being low in photoelectric conversion efficiency.

AS for the distribution of the UV absorber in the surface protective layer, it is possible for the UV absorber to be uniformly or unevenly distributed in the thickness direction.

In the case where the surface protective layer contains the same UV absorber as that contained in the surface side filler, it is desired that the absorber in the surface protective layer be unevenly distributed in the thickness direction such that the concentration is greater in the vicinity of the interface with the surface side filler. In this case, there is provided a pronounced advantage in that the UV absorber contained in the surface side filler is prevented from being diffused into the surface protective layer, whereby the weatherability of the surface side filler is always ensured and in addition to this, the members situated under the surface side filler are prevented from being influenced by ultraviolet rays.

As for the thickness of the surface protective layer, it is determined in consideration of the physical strength thereof and from an economic viewpoint. However, in general, it is preferably in the range of 10 to 200 μm or more preferably, in the range of 30 to 100 μm.

The surface protective layer according to the present invention provides a marked improvement in the adhesion with the surface side filler. As for the reason for this, it can be considered as described in the following. That is, when a UV absorber having a carbonyl group and/or a hydroxyl group in the molecule thereof is incorporated into the inside of the fluororesin through its surface, the UV absorber present at the outermost surface is oriented such that the carbonyl group and/or hydroxyl group are directed outward because the fluororesin has a hydrophobic nature. Particularly, the hydrophilic functional groups of the UV absorber appear at the surface of the fluororesin, thereby making the surface of the fluororesin have improved wetting characteristics, resulting in a marked improvement in the adhesion with the surface side filler composed of, for example, EVA.

In order to attain a further improvement in the adhesion of the surface protective layer with the surface side filler, it is desired for the surface protective layer to be subjected to surface treatment upon its lamination to the surface side filler. The surface treatment in this case can include corona discharging treatment and plasma treatment.

The above described surface protective layer in a solar cell module according to the present invention provides significant advantages. That is, the UV absorber contained in the surface protective layer is always maintained in the originally distributed state without being diffused or volatilized through the surface thereof even upon continuous exposure to light irradiation in outdoor use, whereby the surface protective layer ensures that the surface side filler maintains its properties without being deteriorated while preventing not only the surface side filler but also other members situated under the surface side filler from being negatively influenced by ultraviolet rays. In addition, the surface protective layer always ensures a markedly improved adhesion with the surface side filler positioned under the surface protective layer, and it excels in heat resistance and physical strength, whereby it is free from deformation of its original shape and is free from a reduction in physical strength even upon repeated use over long period of time under severe environmental conditions.

Further, the surface protective layer has a highly improved weatherability and transparency. And the surface protective layer has a surface with an improved water repellency and an improved physical strength.

In the following, description will be made of a process for the production of a solar cell module according to the present invention using the foregoing photovoltaic element, surface side filler resin, surface protective film, and back face protective materials.

In a typical embodiment, to enclose a light receiving face of the photovoltaic element by the surface side filler, a sheet of a filler material is obtained by using a heat-fused product of the filler material (this sheet will be hereinafter referred to as a filler material sheet) and then the filler material sheet is laminated on the surface of the photovoltaic element by way of thermocompression bonding.

Particularly, a solar cell module according to the present invention may be produced, for example, by providing a photovoltaic element 101, a filler material sheet for the surface side filler 102 (hereinafter referred to as surface side filler material sheet 102), a fluororesin film for the surface protective layer 103 (hereinafter referred to as surface protective film 103), a filler material sheet for the back side filler 104 (hereinafter referred to as back side filler material sheet 104), a back face protective film 105, and a back face reinforcing member 106, laminating the surface side filler sheet 102 and the surface protective film 103 in the named order on the surface of the photovoltaic element 101, then laminating, on the rear face of the photovoltaic element 101, a first back side filler material sheet 104, the back face protective film 105, a second back side filler material sheet 104, and the back face reinforcing member 106 in the named order thereby obtaining a composite, and subjecting the composite to thermocompression boding treatment, whereby a solar cell module is produced. The thermocompression bonding treatment should be conducted at a desired temperature for a desired period of time so that the crosslinking reaction sufficiently proceeds in the filler material sheet.

The thermocompression bonding treatment can include vacuum lamination and roll lamination.

In the following, the present invention will be described in more detail with reference to examples which are not intended to restrict the scope of the present invention.

EXAMPLE 1

1. Preparation of photovoltaic element (solar cell):

There was prepared a photovoltaic element having the configuration shown in FIGS. 2(*a*) and 2(*b*) and which has a semiconductor active layer composed of a amorphous silicon material (that is, a-Si material) in the following manner. This solar cell will be hereinafter referred to as a a-Si cell.

That is, there was firstly provided a well-cleaned stainless steel plate as the substrate 201. On the substrate, there was formed a two-layered back reflecting layer 202 comprising a 5000 Å thick Al film and a 5000 Å thick ZnO film by means of a conventional sputtering process. On the back reflecting layer 202 thus formed, there was formed a tandem type photoelectric conversion semiconductor layer as the semiconductor active layer 203 comprising a 150 Å thick n-type amorphous silicon layer/a 4000 Å thick i-type amorphous silicon layer/a 100 Å thick p-type microcrystalline silicon layer/a 100 Å thick n-type amorphous silicon layer/ an 800 Å thick i-type amorphous silicon layer/a 100 Å thick p-type microcrystalline silicon layer laminated in the named order from the substrate side by means of a conventional plasma CVD process, wherein each n-type amorphous silicon layer was formed using $SiH_4$ gas, $PH_3$ gas, and $H_2$ gas, each i-type amorphous silicon layer was formed using $SiH_4$ gas and $H_2$ gas, and each p-type microcrystalline silicon layer was formed using $SiH_4$ gas, $BF_3$ gas, and $H_2$ gas. Then, on the semiconductor active layer 203, there was formed a 700 Å thick transparent and conductive layer 204 composed on $In_2O_3$ by means of a conventional heat resistance evaporation process wherein an In source was evaporated in an $O_2$ atmosphere. Successively, an AG-paste comprising powdered Ag dispersed in polyester resin (trademark name: Ag-past No. 5007, produced by Du Pont Company) was screen-printed on the transparent and conductive layer 204, followed by drying, to thereby form a grid electrode as the collecting electrode 205. A copper tab as the negative power output terminal 206b was fixed to the substrate 201 using a stainless solder 208, and a tin foil tape as the positive power output terminal 206a was fixed to the collecting electrode 205 using an electroconductive adhesive 207. Thus, there was obtained a solar cell.

The above procedures were repeated to obtain seventy solar cells.

2. Preparation of solar cell module:

Using each of the solar cells obtained in the above 1, there were prepared seventy solar cell modules each having the configuration shown in FIG. 3 in the following manner.

Figure 3:
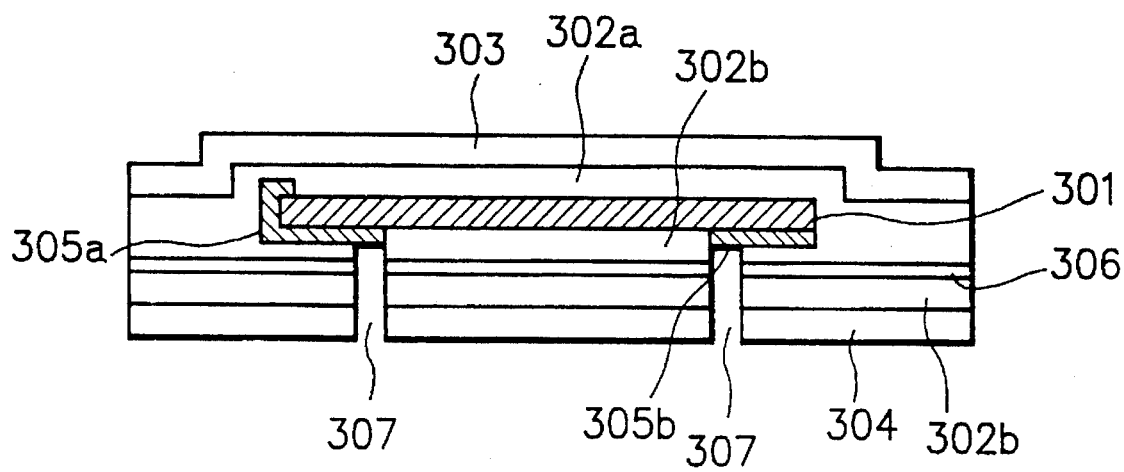
FIG. 3 is a schematic cross-sectional view illustrating the structure of another solar cell module according to the present invention.
Figure 4:
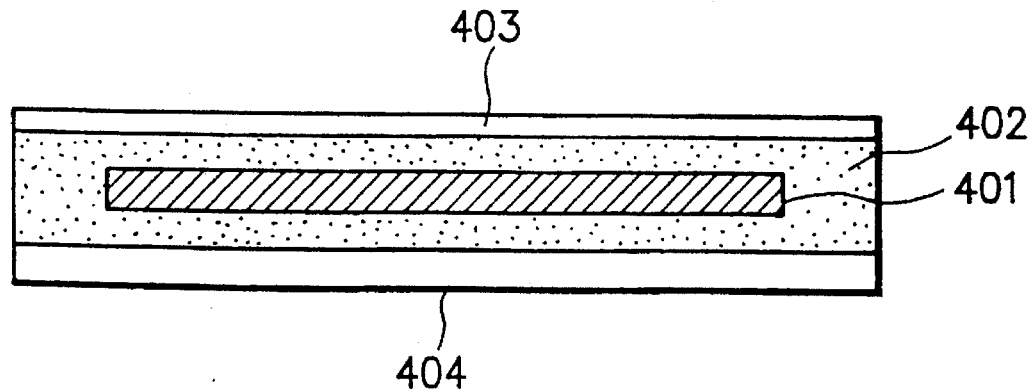
FIG. 4 is a schematic cross-sectional view illustrating the structure of a prior art solar cell module for comparison purposes.

In FIG. 3, reference numeral 301 indicates a photovoltaic element (corresponding to the solar cell 200 in this case), reference numeral 302a a surface side filler, reference numeral 302b a back face side filler, reference numeral 303 a surface protective layer, reference numeral 304 a back face reinforcing member, reference numeral 305a a positive power output terminal 206a), reference numeral 305b a negative power output terminal corresponding to the foregoing power output terminal 206b), reference numeral 306 a back face protective film, and reference numeral 307 a pair of wiring holes each for one of the power output terminals 305a and 305b. Each power output hole penetrates through the back face constituents from the back face reinforcing member 304 such that it reaches the corresponding power output terminal.

3. Preparation of a fluororesin film to be used as the surface protective layer 303:

There was provided a stretched ethylene-tetrafluoroethylene copolymer (ETFE) film of 38 μm in thickness. The ETFE film was immersed in a 10% xylene solution of 2-hydroxy-4-n-octoxybenzophenone as a benzophenone series UV absorber, followed by refluxing at 100° C. for 24 hours. The ETFE film thus treated was washed with xylene, followed by drying at 80° C. for 30 minutes in an oven. The surface thereof to be contracted to the surface side filler 302a was then subjected to corona discharging surface treatment. Thus, there was obtained a benzophenone series UV absorber-containing ETFE film having surface treated by corona discharging as the surface protective layer 303.

The light transmittance of the UV absorber-containing ETFE film, was then measured by means of a spectrophotometer in the ultraviolet and visible region U-4000 (produced by Hitachi, Ltd.) by using light having a wavelength of 300 to 350 nm and also by using light having a wavelength of 400 to 1000 nm.

Another stretched ethylene-tetrafluoroethylene copolymer (ETFE) film of 38 μm in thickness was provided as a reference standard. As for the reference standard ETFE film, its light transmittance was measured in the same manner as in the above.

The measured results for the UV absorber-containing ETFE film were compared with the measured results for the reference standard ETFE film. As a result, it was found that the transmittance of the former in the case (a) is less than 0.3 relative to that of the latter in the case (a) and the light transmittance of the former in the case (b) is greater than 0.95 relative to that of the latter in the case (b).

4. Preparation of solar cell module:

On the light receiving face of the solar cell obtained above, there were laminated a 460 μm thick UV absorber-containing EVA film 302a (produced by Mobay Company) and the UV absorber-containing ETFE film 303 obtained above in the named order. On the rear face of the resultant, there were laminated a 63.5 μm thick nylon film 306 (trademark name: DARTEK, produced by Du Pont Company), a UV absorber-containing EVA film 302b (produced by Mobay Company) and a galvalume steel member (or a Zn-coated steel member) 304 in the named order. Thus, there was obtained a stacked body. The stacked body obtained was placed in a vacuum laminator, wherein it was subjected to heat treatment at 150° C. for 30 minutes while evacuating the inside of the vacuum laminator to a predetermined vacuum degree, followed by cooling to room temperature.

In the above, the power output terminal 305a was extended to the rear side of the solar cell so that not only the power output terminal 305b but also the power output terminal 305a could be wired to the outside through the wiring holes 307. Thus, there was obtained a solar cell module.

In this way, there were obtained seventy solar cell module samples.

EVALUATION

As for the resultant solar cell modules, evaluation was conducted with respect to (1) initial photoelectric conversion efficiency, (2) light resistance, (3) weatherability, (4) heat resistance, (5) endurance against changes in environmental temperature, (6) endurance against changes in environmental temperature and humidity, and (7) resistance to moisture invasion.

The results obtained are collectively shown in Table 1.

The evaluation of each of the above evaluated items (1) to (7) was conducted in the following manner. In the evaluation of each item, ten solar cell module samples were used. The result shown in Table 1 in each evaluation is of the solar cell module sample having shown the worst result among the ten solar cell module samples.

(1) Evaluation of the initial photoelectric conversion efficiency:

The solar cell module sample was subjected to measurement with respect to its initial photoelectric conversion efficiency by means of a solar simulator (trademark name: SPI-SUN SIMULATOR 200A (AM 1.5), produced by SPIRE Company). The measured result obtained in this Example 1 is shown in Table 1 by a value of 1, which is a comparison standard for other results measured in the other examples and comparative example described in the following.

(2) Evaluation of the light resistance:

The solar cell module sample was placed in an ultra exposure tester (produced by Suga Test Instruments Co., Ltd.), wherein it was subjected to a dew cycle test of alternately repeating (a) a cycle of irradiating ultraviolet rays of 300 nm to 400 nm in wavelength at an intensity of 100 mW/cm$^2$ from a metal halide lamp under conditions of 63° C. for the black panel and 50% RH for the environmental humidity and (b) a cycle of conducting dew condensation under conditions of 30° C. for the environmental temperature and 96% RH for the environmental humidity without irradiating the ultraviolet rays, wherein the solar cell module sample was irradiated with the above ultraviolet rays in a quantity corresponding to the quantity of ultraviolet rays irradiated in Tokyo for 20 years.

Thereafter, its exterior appearance was observed. The observed result shown by a mark O in Table 1 indicates the case where no change was observed in the exterior appearance. As for the cases with a change in the exterior appearance, comments are described in Table 1.

In addition, as for the solar cell module sample dedicated for the dew cycle test, its photoelectric conversion efficiency was examined by means of the SPI-SUN SIMULATOR 240A (AM 1.5). The measured result obtained in this Example 1 is shown in Table 1 by a value of 1, which is a comparison standard for other results measured in the other examples and comparative example described in the following.

(3) Evaluation of the weatherability:

The solar cell module sample was placed in an xenon-arc sunshine weather meter (produced by Heraeus Company), wherein it was subjected to an accelerated weathering test of alternately repeating (a) a cycle of irradiating pseudo sunlight of 100 Mw/cm$^2$ from a Xenon lamp and (b) a cycle of falling pure water wherein the alternate repetition of the cycles (a) and (b) was conducted for 5000 hours. Thereafter, its exterior appearance was observed. The observed result shown by a mark O in Table 1 indicates the case where no change was observed in the exterior appearance. As for the cases with a change in the exterior appearance, comments are described in Table 1.

(4) Evaluation of the heat resistance:

The solar cell module sample was exposed to an atmosphere of 100° C. for 24 hours, and thereafter, its exterior appearance was observed. The observed result shown by a mark O in Table 1 indicates the case where no change was observed in the exterior appearance. As for the cases with a change in the exterior appearance, comments are described in Table 1.

(5) Evaluation of the endurance against changes in environmental temperature:

The solar cell module sample was subjected to alternate repetition of (a) a cycle of exposure to an atmosphere of −40° C. for an hour and (b) a cycle of exposure to an atmosphere of 90° C. for an hour 50 times, and thereafter, its exterior appearance was observed. The observed result shown by a mark O in Table 1 indicates the case where no change was observed in the exterior appearance. As for the cases with a change in the exterior appearance, comments are described in Table 1.

(6) Evaluation of the endurance against changes in environmental temperature and humidity:

The solar cell module sample was subjected to alternate repetition of (a) a cycle of exposure to an atmosphere of −40° C. for an hour and (b) a cycle of exposure to an atmosphere of 85° C./85% RH for 4 hours 50 times, and thereafter, its exterior appearance was observed. The observed result shown by a mark O in Table 1 indicates the case where no change was observed in the exterior appearance. As for the cases with change in the exterior appearance, comments are described in Table 1.

(7) Evaluation of the resistance to moisture invasion:

The solar cell module sample was subjected to a pressure cooker test under conditions of 120° C. for the environmental temperature and 2 arm for the water vapor pressure for 1000 hours. Thereafter, its exterior appearance was observed. The observed result shown by a mark O in Table 1 indicates the case where no change was observed in the exterior appearance. As for the cases with a change in the exterior appearance, comments are described in Table 1.

In Table 1, there is shown a result obtained as a result of the total evaluation based on the results of the items (1) to (7). The total evaluation result shown in Table 1 is based on the following criteria:

⊚: a case where the solar cell module sample is excellent in all the evaluation items, O: a case where the solar cell module sample is satisfactory in all the evaluation items, Δ: a case where the solar cell module sample is problematic for use under severe environmental conditions, and X: a case where the solar cell module sample is problematic and it is not practically acceptable.

EXAMPLE 2

The procedures of Example 1 were repeated, except that the ETFE film used in the preparation of the fluororesin film as the surface protective layer 303 was replaced by a film of poly(chlorotrifluoroethylene) resin (PCTFE), to thereby obtain seventy solar cell module samples.

As for the solar cell module samples obtained, evaluation was conducted in the same manner as in Example 1. The results obtained are collectively shown in Table 1.

EXAMPLE 3

The procedures of Example 1 were repeated, except that the 2-hydroxy-4-n-octoxybenzophenone as the IV absorber used in the preparation of the fluororesin film as the surface protective layer 303 was replaced by 2-(2-hydroxy-5-tert-octylphenyl)benzotriazole as a benzotriazole series UV absorber, to thereby obtain seventy solar cell module samples.

As for the solar cell module samples obtained, evaluation was conducted in the same manner as in Example 1. The results obtained are collectively shown in Table 1.

EXAMPLE 4

The procedures of Example 1 were repeated, except that the ETFE film used in the preparation of the fluororesin film as the surface protective layer 303 was replaced by a 50 μm thick film of ethylene-chlorotrifluoroethylene copolymer (ECTFE), to thereby obtain seventy solar cell module samples.

As for the solar cell module samples obtained, evaluation was conducted in the same manner as in Example 1. The results obtained are collectively shown in Table 1.

EXAMPLE 5

The procedures of Example 1 were repeated, except that the ETFE film used in the preparation of the fluororesin film as the surface protective layer 303 was replaced by a 50 μm thick film of tetrafluoroethylene-perfluoroalkylvinylether copolymer (PFA), to thereby obtain seventy solar cell module samples.

As for the solar cell module samples obtained, evaluation was conducted in the same manner as in Example 1. The results obtained are collectively shown in Table 1.

EXAMPLE 6

The procedures of Example 1 were repeated, except that the ETFE film used in the preparation of the fluororesin film as the surface protective layer 303 was replaced by a 50 μm thick film of tetrafluoroethylene-hexafluoropropylene copolymer (FEP), to thereby obtain seventy solar cell module samples.

As for the solar cell module samples obtained, evaluation was conducted in the same manner as in Example 1. The results obtained are collectively shown in Table 1.

EXAMPLE 7

The procedures of Example 1 were repeated, except that the incorporation of the UV absorber into the ETFE film was conducted by the thermal diffusion method and a face of the resultant UV absorber-containing ETFE film to be contacted with the EVA film as the surface side filler was subjected to surface treatment by means of corona discharging, to thereby obtain seventy solar cell module samples.

As for the solar cell module samples obtained, evaluation was conducted in the same manner as in Example 1. The results obtained are collectively shown in Table 1.

In the above, the incorporation of the UV absorber into the ETFE film was conducted by providing a 50 μm thick stretched ETFE film having a surface masked by a shield, placing the ETFE film in a vacuum chamber containing solid particles of 2-hydroxy-4-n-octoxybenzophenone as a benzophenone series UV absorber therein, and heating the inside of the vacuum chamber at 200° C. for 6 hours, wherein a vapor of the benzophenone series UV absorber was generated and the ETFE film having a surface masked by a shield was exposed to said vapor of the benzophenone series UV absorber. In this way, there were obtained a plurality of ETFE films each incorporated with the UV absorber by the thermal diffusion method.

One of the resultant UV absorber-containing ETFE films was subjected to examination with respect to light transmittance. That is, for the UV absorber-containing ETFE film, an about 10 μm thick specimen (i) was sliced off from the side thereof which had been exposed to the vapor of the UV absorber, and another about 10 μm thick specimen (ii) was sliced off from the remaining side thereof. The light transmittance of each of the specimens (i) and (ii) was measured by means of a spectrophotometer in the ultraviolet and visible regions (U-4000 produced by Hitachi, Ltd.) using light having a wavelength of 350 nm.

Another stretched ethylene-tetrafluoroethylene copolymer (ETFE) film of 50 μm in thickness was provided as a reference standard. An about 10 μm thick specimen (i') was sliced off from a side thereof, and another about 10 μm thick specimen (ii') was sliced off from the remaining side thereof. As for each of the specimens (i') and (ii') of the reference standard ETFE film, the light transmittance was measured in the same manner as in the above.

The measured result for the specimen (i) was compared with that for the specimen (i'). As a result, it was found that the transmittance of the specimen (i) is 0.2 relative to that of the specimen (i'). Similarly, the measured result for the specimen (ii) was compared with that for the specimen (ii'). As a result, it was found that the transmittance of the specimen (ii) is 0.8 relative to that of the specimen (ii').

From the observed results obtained in the above, the foregoing UV absorber-containing ETFE film was found to have a varied concentration distribution of the UV absorber which is greater on the side of the face exposed to the vapor of the UV absorber and is reduced on the side of the face masked by the shield.

As for each of the remaining UV absorber-containing ETFE films used for the preparation of the solar cell module sample, a face thereof to be contacted with the EVA film as the surface side filler was subjected to surface treatment by means of corona discharging, prior to laminating on the EVA film, as above described.

COMPARATIVE EXAMPLE 1

The procedures of Example 1 were repeated, except that no UV absorber was incorporated into the ETFE film, to thereby obtain seventy solar cell module samples.

As for the solar cell module samples obtained, evaluation was conducted in the same manner as in Example 1. The results obtained are collectively shown in Table 1.

COMPARATIVE EXAMPLE 2

The procedures of Example 2 were repeated, except that no UV absorber was incorporated into the PCTFE film, to thereby obtain seventy solar cell module samples.

As for the solar cell module samples obtained, evaluation was conducted in the same manner as in Example 1. The results obtained are collectively shown in Table 1.

COMPARATIVE EXAMPLE 3

The procedures of Example 1 were repeated, except that the UV absorber-containing ETFE film used as the surface protective layer was replaced by a 50 μm thick polyvinyl fluoride film containing a UV absorber (trademark name: TEDLAR, produced by Du Pont Company), to thereby obtain seventy solar cell module samples.

As for the solar cell module samples obtained, evaluation was conducted in the same manner as in Example 1. The results obtained are collectively shown in Table 1.

COMPARATIVE EXAMPLE 4

The procedures of Example 1 were repeated, except that no UV absorber was incorporated into the ETFE film as the surface protective layer and the UV absorber-containing EVA film as the surface side filler was replaced by a film of a chlorotrifluoroethylene-vinyl ether copolymer resin composition prepared as described below, to thereby obtain seventy solar cell module samples.

As for the solar cell module samples obtained, evaluation was conducted in the same manner as in Example 1. The results obtained are collectively shown in Table 1.

The chlorotrifluoroethylene-vinyl ether copolymer resin composition film was prepared in the following manner. That is, there was provided chlorotrifluoroethylene-vinyl ether copolymer resin (trademark name: LUMIFLON LF400, produced by Asahi Glass Co., Ltd.). To 100 parts by weight of the copolymer resin, there were added 3 parts by weight of 2,5-dimethyl-2,5-bis(t-butylperoxy)hexane as a crosslinking agent, 2 parts by weight of triallylcyanulate as a crosslinking promoter, 0.3 part by weight of γ-methacryloxypropyltrimethoxysilane as a coupling agent, 0.3 part by weight of 2-(2-hydroxy-5-t-octylphenyl)benzotriazole as a UV absorber, 0.1 part by weight of bis(2,2,6,6-tetramethyl-4-piperidyl)sebacate as a light stabilizer, and 0.2 part by weight of tris(mono-nonylphenyl)phosphate as an antioxidant while stirring, whereby a mixture was obtained. The mixture was fused at 100° C., followed by subjecting to T-die extrusion, thereby obtaining an about 400 μm thick film. The resultant film was used as the surface side filler.

Based on the results shown in Table 1, it is understood that each of the solar cell modules in which the surface protective layer is constituted by a specific, highly transparent fluororesin containing a UV absorber obtained in Examples 1 to 7 belonging to the present invention surpasses the comparative solar cell modules obtained in Comparative Examples 1 to 4. Particularly, it is understood that each of the solar cell modules according to the present invention is absolutely free from the occurrence of yellowing or clouding in the constituent resin materials and also, absolutely free from the occurrence of separation between the surface side filler and the surface protective layer and also between the surface side filler and the photovoltaic element in the tests of light resistance and weatherability and thus, markedly excels in light resistance and weatherability. It is also understood that each of the solar cell modules according to the present invention is good enough in the endurance tests and pressure cooker test under severe conditions. It is further understood that each of the solar cell modules according to the present invention is excellent or good enough in initial photoelectric conversion efficiency and is hardly deteriorated in terms of the photoelectric conversion efficiency over a long period of time. Therefore, it is understood that each of the solar cell modules according to the present invention is satisfactorily usable as a power generation source outdoors under severe environments.

On the other hand, as for the comparative solar cell modules obtained in Comparative Examples 1 to 4, it is understood that they are inferior to each of the solar cell modules obtained in Examples 1 to 7. Particularly, the comparative solar cell modules obtained in Comparative Examples 1 and 2 are inferior in the light resistance, weatherability and endurance against changes in environmental temperature and humidity. In fact, as apparent from Table 1, the surface side filler of each of them was yellowed and/or clouded in the test of light resistance, and each of them suffered from a separation between the surface side filler and the surface protective layer not only in the test of weatherability but also in the test of endurance against changes in environmental temperature and humidity.

The comparative solar cell module obtained in Comparative Example 3 is inferior in the initial photoelectric conversion efficiency, heat resistance, endurance against changes in environmental temperature, and resistance to moisture invasion. In fact, its surface protective layer was deformed in the test of heat resistance, the test of endurance against changes in environmental temperature, and the pressure cooker test, because of the deformation temperature thereof being low.

The comparative solar cell module obtained in Comparative Example 4 is inferior in the resistance to moisture invasion. In fact, this comparative solar cell module suffered from a separation between the surface side filler and the photovoltaic elements in the pressure cooker test.

TABLE 1

| | initial photoelectric conversion efficiency (with the value in Example 1 being set at 1) | light resistance | | weatherability | heat resistance | endurance against changes in environmental temperature | endurance against changes in environmental temperature and humidity | resistance to moisture invasion | total evaluation |
|---|---|---|---|---|---|---|---|---|---|
| | | exterior appearance | photoelectric conversion efficiency after test (with the value in Example 1 being set at 1) | | | | | | |
| Example 1 | 1.0 | ○ | 1.0 | ○ | ○ | ○ | ○ | ○ | ⊚ |
| Example 2 | 0.99 | ○ | 1.0 | ○ | ○ | ○ | ○ | ○ | ○ |
| Example 3 | 0.97 | ○ | 1.0 | ○ | ○ | ○ | ○ | ○ | ○ |
| Example 4 | 1.0 | ○ | 1.0 | ○ | ○ | ○ | ○ | ○ | ⊚ |
| Example 5 | 1.0 | ○ | 1.0 | ○ | ○ | ○ | ○ | ○ | ⊚ |
| Example 6 | 1.0 | ○ | 1.0 | ○ | ○ | ○ | ○ | ○ | ⊚ |
| Example 7 | 1.0 | ○ | 1.0 | ○ | ○ | ○ | ○ | ○ | ⊚ |
| Comparative Example 1 | 1.0 | surface side filler yellowed or clouded | 0.85 | separation occurred*1 | ○ | ○ | separation occurred*1 | ○ | x |
| Comparative Example 2 | 1.0 | surface side filler yellowed or clouded | 0.90 | separation occurred*1 | ○ | ○ | separation occurred*1 | ○ | x |
| Comparative Example 3 | 0.95 | ○ | 0.95 | ○ | surface protective layer deformed | surface protective layer | ○ | surface protective layer deformed | x |
| Comparative Example 4 | 1.0 | ○ | 1.0 | ○ | ○ | ○ | ○ | separation occurred*2 | Δ | note)
*1 Separation occurred between surface protective layer and surface side filler.
*2 Separation occurred between surface side filler and photovoltaic element.

What is claimed is:

1. A solar cell module comprising (a) a photovoltaic element, (b) a transparent resin filler layer, (c) a transparent surface layer, and (d) a reinforcing member, said transparent resin filler layer (b) and said transparent surface layer (c) being disposed in the named order on a light receiving face of said photovoltaic element, and said reinforcing member (d) being disposed on the rear face of said photovoltaic element, characterized in that said transparent surface layer comprises a film composed of a fluororesin with a fluorine content of 40 to 60 wt. % selected from the group consisting of ethylene-tetrafluoroethylene copolymer, poly(chlorotrifluoroethylene)resin, ethylene-chlorotrifluoroethylene copolymer, tetrafluoroethyle-perfluoroalkylvinylether copolymer, and tetrafluoroethylene-hexafluoropropylene copolymer and which contains an ultraviolet absorber dispersed therein.

2. A solar cell module according to claim 1, wherein the ultraviolet absorber-containing fluororesin film as the surface protective layer has a light transmittance which is of 0.8 or less relative to the value of the transmittance of a reference standard fluororesin film containing no ultraviolet absorber at a wavelength of 300 to 350 nm of the light used for the measurement and has a light transmittance which is of 0.9 or more relative to the value of the transmittance of a reference standard fluororesin film containing no ultraviolet absorber at a wavelength of 400 to 1000 nm of the light used for the measurement.

3. A solar cell module according to claim 1, wherein the ultraviolet absorber-containing fluororesin film as the surface protective layer has a deformation temperature of 70° C. or above at a pressure of $4.6$ $kg/cm^2$.

4. A solar cell module according to claim 1, wherein the ultraviolet absorber contained in the ultraviolet absorber-containing fluororesin film as the surface protective layer is a benzophenone series compound having a molecular weight of 300 or more.

5. A solar cell module according to claim 1 wherein the ultraviolet absorber contained in the ultraviolet absorber-containing fluororesin film as the surface protective layer is a benzotriazole series compound having a molecular weight of 300 or more.

6. A solar cell module according to claim 1, wherein the ultraviolet absorber-containing fluororesin film as the surface protective layer comprises a film formed by a method comprising the steps of (a) providing a film of a fluororesin selected from the group consisting of ethylene-tetrafluoroethylene copolymer, poly(chlorotrifluoroethylene) resin, ethylene-chlorotrifluoroethylene copolymer, tetrafluoroethyle-perfluoroalkylvinylether copolymer, and tetrafluoroethylene-hexafluoropropylene copolymer, (b) immersing said fluororesin film in an organic solvent containing said ultraviolet absorber dissolved therein, and (c) drying the resultant obtained in the step (b) at a desired temperature to volatilize the organic solvent.

7. A solar cell module according to claim 1, wherein the ultraviolet absorber-containing fluororesin film as the surface protective layer comprises a film formed by a method comprising the steps of providing a film of a fluororesin selected from the group consisting of ethylene-tetrafluoroethylene copolymer, poly(chlorotrifluoroethylene) resin, ethylene-chlorotrifluoroethylene copolymer, tetrafluoroethyle-perfluoroalkylvinylether copolymer, and tetrafluoroethylene-hexafluoropropylene copolymer, and exposing said fluororesin film to a vapor of a said ultraviolet absorber.

8. A solar cell module according to claim 1, wherein the transparent resin filler layer comprises a thermoplastic resin.

9. A solar cell module according to claim 8, wherein the thermoplastic resin is a polyolefin series thermoplastic resin.

10. A solar cell module according to claim 9, wherein the polyolefin series thermoplastic resin is selected from the group consisting of ethylene-vinyl acetate copolymer, ethylene-methyl acrylate copolymer, and ethylene-ethyl acrylate copolymer.

11. A solar cell module according to claim 1, wherein the transparent resin filler layer contains an ultraviolet absorber.

12. A solar cell module according to claim 1, wherein the photovoltaic element comprises a photoelectric conversion layer and a transparent conductive layer disposed in the named order on an electrically conductive substrate.

13. A solar cell module according to claim 12, wherein the photoelectric conversion layer comprises a non-single crystal semiconductor film.

14. A solar cell module according to claim. 13, wherein the non-single crystal semiconductor film is an amorphous silicon semiconductor film.

* * * * *

UNITED STATES PATENT AND TRADEMARK OFFICE
CERTIFICATE OF CORRECTION

PATENT NO. : 5,582,653

DATED : December 10, 1996

INVENTORS : ICHIRO KATAOKA ET AL.

It is certified that error appears in the above-identified patent and that said Letters Patent is hereby corrected as shown below:

ON TITLE PAGE

[75] Inventors: "Mori, Ikoma;" should read --Mori, Ikoma-shi;-- and "; Ayako Komori, Nara," should read --; Ayako Komori, Nara-shi,--.

COLUMN 1

Line 40, "have" should read --have been--.

COLUMN 3

Line 16, "to be" should be deleted.

COLUMN 4

Line 12, "delete "are";
Line 13, "change "necessary" to --need--;
Line 32, "to be" should be deleted.

COLUMN 8

Line 65, "is" should read --is a--.

COLUMN 9

Line 8, "as" should be deleted;
Line 22, "cress-sectional" should read --cross sectional sectional--.

UNITED STATES PATENT AND TRADEMARK OFFICE
CERTIFICATE OF CORRECTION

PATENT NO. : 5,582,653

DATED : December 31, 1996

INVENTORS : ICHIRO KATAOKA ET AL.

Page 2 of 3

It is certified that error appears in the above-identified patent and that said Letters Patent is hereby corrected as shown below:

COLUMN 10

Line 15,   "an other" should read --another--.

COLUMN 14

Line 37,   "filer" should read --filler--.

COLUMN 17

Line 6,    "filler of" should read --filler--;
   Line 22,   "AS" should read --As--.

COLUMN 18

Line 64,   "a" (2nd occcurrence) should read --an--.

COLUMN 19

Line 22,   "on" should read --of--.

COLUMN 22

Line 13,   "arm" should read --atm--;
   Line 45,   "IV" should read --UV--.

UNITED STATES PATENT AND TRADEMARK OFFICE
CERTIFICATE OF CORRECTION

PATENT NO. : 5,582,653

DATED : December 10, 1996

INVENTORS : ICHIRO KATAOKA ET AL.

Page 3 of 3

It is certified that error appears in the above-identified patent and that said Letters Patent is hereby corrected as shown below:

COLUMN 26

Table 1
   Lines 57-60, "surface protection layer" should read --surface protective layer deformed--.

COLUMN 27

Line 38, "claim 1" should read --claim 1,--;

COLUMN 28

Line 40, "claim." should read --claim--.

Signed and Sealed this

Seventh Day of October, 1997

Attest:

BRUCE LEHMAN

Attesting Officer

Commissioner of Patents and Trademarks